United States Patent
Yang et al.

(10) Patent No.: US 7,939,225 B2
(45) Date of Patent: May 10, 2011

(54) MASK FOR CONTROLLING LINE END SHORTENING AND CORNER ROUNDING ARISING FROM PROXIMITY EFFECTS

(75) Inventors: Chin-Cheng Yang, Gangshan Town (TW); Chiao-Wen Yeh, Rueifang Township (TW); Chih-Haw Huang, Jhubei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 538 days.

(21) Appl. No.: 11/971,900

(22) Filed: Jan. 9, 2008

(65) Prior Publication Data

US 2009/0176069 A1    Jul. 9, 2009

(51) Int. Cl.
  *G03F 1/00*    (2006.01)
  *G03C 5/00*    (2006.01)
(52) U.S. Cl. ............................. 430/5; 430/394
(58) Field of Classification Search ............... 430/5, 311, 430/394
See application file for complete search history.

(56) References Cited

U.S. PATENT DOCUMENTS

| | | | |
|---|---|---|---|
| 5,725,973 A * | 3/1998 | Han et al. | 430/5 |
| 2003/0013024 A1* | 1/2003 | Pierrat | 430/5 |
| 2007/0184359 A1* | 8/2007 | Misaka | 430/5 |
| 2007/0184361 A1* | 8/2007 | Misaka | 430/5 |

* cited by examiner

*Primary Examiner* — Stephen Rosasco
*Assistant Examiner* — Rashid Alam
(74) *Attorney, Agent, or Firm* — Jianq Chyun IP Office

(57) ABSTRACT

A mask for producing an image feature on an image surface during a semiconductor fabrication process is provided, the mask comprising a main feature having opaque areas and transmissive areas arranged in the form of the image feature, wherein each end of the main feature includes at least one of an opaque edge and a transmissive edge, wherein the opaque edge includes a set of transmissive assist features arranged therein such that the set of transmissive assist features align alternately with the transmissive areas of the main feature, and the transmissive edge includes a set of opaque assist features arranged therein such that the set of opaque assist features align alternately with the opaque areas of the main feature.

12 Claims, 4 Drawing Sheets

MASK FOR CONTROLLING LINE END SHORTENING AND CORNER ROUNDING ARISING FROM PROXIMITY EFFECTS

BACKGROUND

This application relates to the process of fabricating a semiconductor device. More particularly, the invention relates to a mask that effectively corrects optical proximity effects when an image feature is formed on an image surface during semiconductor fabrication.

In the manufacture of semiconductor devices, many photolithographic process steps are involved to define and create the image feature of circuit elements or layouts onto a substrate layer. Conventional photolithography process is performed using a mask having opaque and transparent regions that causes light to fall on photosensitive material in a desired pattern. After light is shone through the mask onto the photosensitive material, the photosensitive material is then developed leaving the printed image of the circuit and/or component of the substrate layer. The image substrate is subsequently processed with techniques such as etching, deposition and doping to alter the substrate layer with the transferred pattern. As the feature size continues to decrease to approach the resolution of the fabrication process, circuit designers are forced to deal with proximity effect problems that arise as a consequence of the optical lithographic process.

One problem that arises from the optical photolithography process includes "line end shortening" that results in the shortening or "pull-back" of the line ends in the printed image. In order to compensate for line end shortening, the circuit designers often add additional features, such as hammer heads 10 shown in FIG. 1 onto the line ends 1 before carrying out the photolithographic process. These hammer heads 10 can effectively compensate by optical proximity correction (OPC) for the problem of line end shortening in some situations. However, if these hammer heads 10 are arranged too close to each other, a pattern bridging problem can potentially be created in the printed image as illustrated in FIG. 1. The prior art describes a system to control line-end shortening arising from optical effects by using double exposure. The system includes defining an unexposed line on the photoresist layer using a first mask and exposing the photoresist layer through the first mask. The system also requires a second mask for defining an exposure region and a second exposure that cut through the unexposed line on the photoresist layer, so as to resolve the pattern bridging problem and create two opposing line ends on opposite sides of the exposure region. Other additional features, such as scattering bars may also be placed adjacent to the line ends to control line end shortening problem.

"Line corner rounding" is the degree to which feature corners that should be at sharp angles are instead rounded by the lithography process. In some cases, the line corner rounding may lead to pattern bridging problem. The line corner rounding may also result in a decreased tolerance for overlay shift in the double patterning methods. The line corner rounding may be corrected by adding serifs to outside corners, which are called positive serifs, and subtracting serifs from the inside corners, which are called negative serifs, to the feature in the photomask. This is shown in FIG. 2, in which the positive serif 193 has been added to the outside corner of the feature 171, and the negative serif 197 has been removed from the inside corner of the feature 171.

In the semiconductor fabrication which involves double patterning technique (DPT), a patterned feature may be produced by two consecutive exposures via either one mask or two different masks. It is also important to maintain the accuracy of pattern shape produced by double exposure in order to avoid short form pattern overlay. Therefore, there is a need to provide a mask design which effectively control line end shortening and corner rounding arising from proximity effects to achieve desired pattern accuracy and gain more process window.

BRIEF SUMMARY

In one embodiment of the invention a mask is provided to produce an image feature on an image surface during a semiconductor fabrication process. The mask includes a main feature that has opaque and transmissive areas arranged in the form of the image feature. Each end of the main feature may include at least one of an opaque edge and a transmissive edge. The opaque edge has a set of transmissive assist features arranged therein such that the set of transmissive assist features align alternately with the transmissive areas of the main feature, and the transmissive edge has a set of opaque assist features arranged therein such that the set of opaque assist features align alternately with the opaque areas of the main feature.

Another embodiment of the invention provides a system for exposing a photoresist layer during semiconductor fabrication. The system includes a mask, a positioning means for positioning the mask over the photoresist layer, and an exposure means for exposing the photoresist layer through the mask. The mask includes a main feature having opaque and transmissive areas arranged to reflect an image feature of the photoresist layer. Each end of the main feature may include at least one of an opaque edge and a transmissive edge. The opaque edge has a set of transmissive assist features arranged therein such that the set of transmissive assist features align alternately with the transmissive areas of the main feature. The transmissive edge has a set of opaque assist features arranged therein such that the set of opaque assist features align alternately with the opaque areas of the main feature.

Another embodiment of the invention provides an integrated circuit that includes a line end created through use of a mask that controls line end shortening and corner rounding arising from proximity effects. The mask includes a main feature having opaque and transmissive areas arranged to reflect a patterned feature of the line end, at least one of an opaque edge or a transmissive edge located at each end of the main feature, wherein the opaque edge has a set of transmissive assist features arranged therein such that the set of transmissive assist features align alternately with the transmissive areas of the main feature, and the transmissive edge has a set of opaque assist features arranged therein such that the set of opaque assist features align alternately with the opaque areas of the main feature.

Additional embodiments, including their respective advantages, will be set forth in the description which follows. It is to be understood that both the foregoing general description and the following detailed description are exemplary and explanatory only and are not restrictive of the invention, as claimed.

BRIEF DESCRIPTION OF THE DRAWINGS

The embodiments illustrated in the figures of the accompanying drawings herein are by way of example and not by way of limitation. In the drawings:

FIG. 3b shows a printed image feature resulted from exposure using the mask illustrated in FIG. 3a.

DETAILED DESCRIPTION

Figure 1:
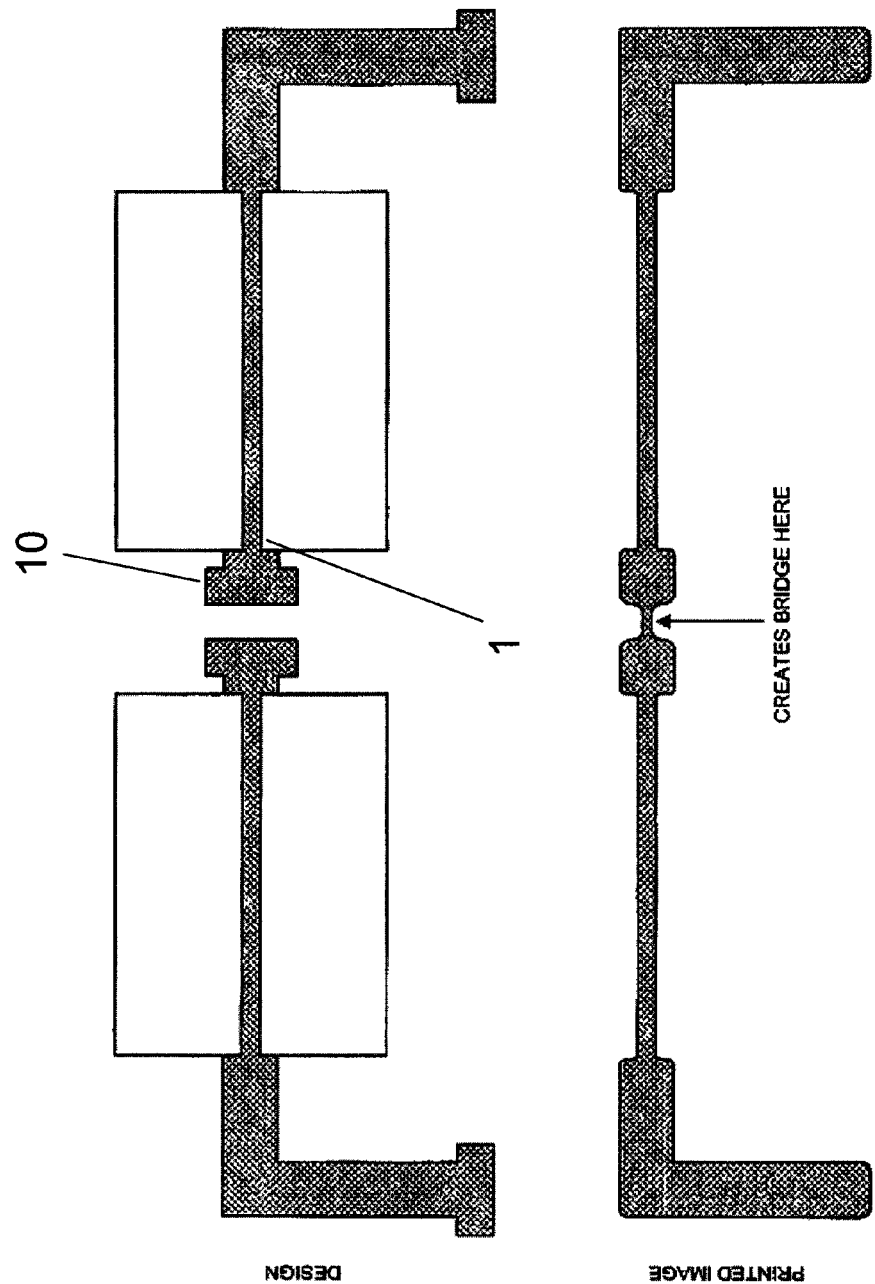
FIG. 1 is a prior art plan view of a mask design and a printed image resulted from the mask design.
Figure 2:
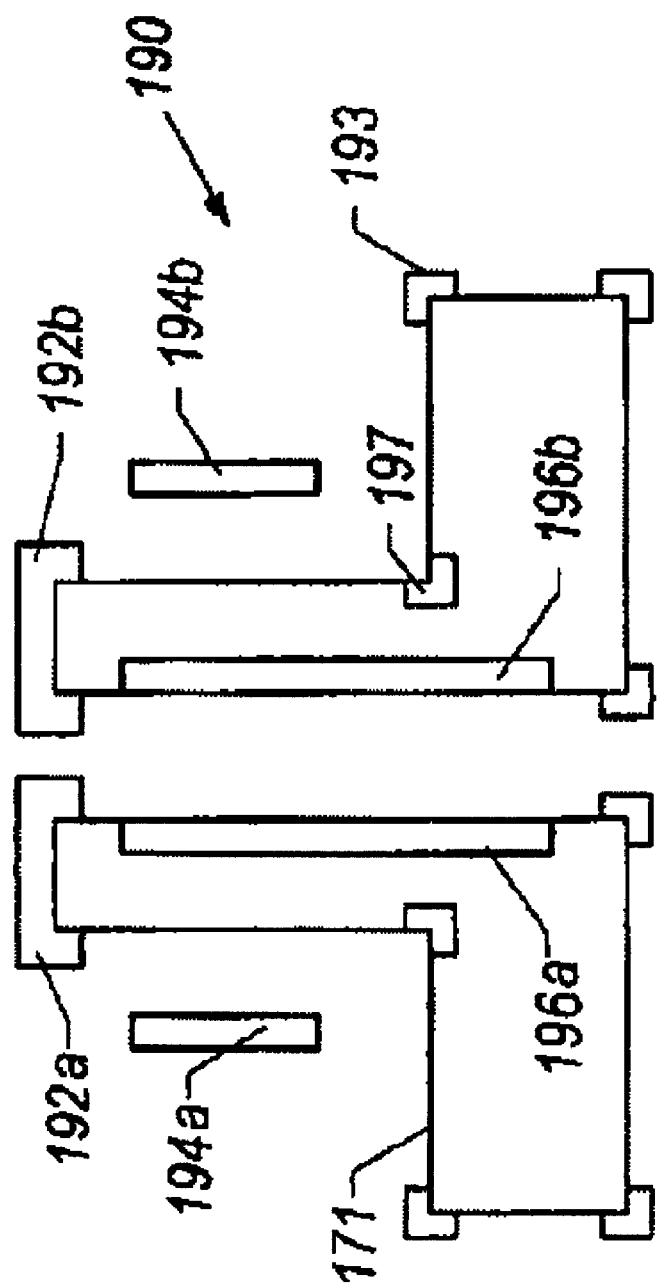
FIG. 2 is a prior art plan view of a conventional mask design with OPC assist features added to corners and edges of the main mask feature.

Although the present invention has been described herein with reference to specific example embodiments, it will be evident that various modifications and changes may be made to these embodiments without departing from the broader spirit and scope of the invention. Accordingly, the specification and drawings are to be regarded in an illustrative rather than a restrictive sense. Wherever possible, the same reference numbers will be used throughout the drawings to refer to the same or like parts.

Examples of the present invention provide a mask for producing an image feature on an image surface during a semiconductor fabrication process. The mask is designed to effectively control line end shortening and line corner rounding problems without altering the semiconductor fabrication process. The mask may include a main feature that has both opaque and transmissive areas arranged in the form of the image feature. Each end of the main feature may include at least one of an opaque edge and a transmissive edge. The opaque edge includes a set of transmissive assist features arranged therein such that the set of transmissive assist features align alternately with the transmissive areas of the main feature, and the transmissive edge includes a set of opaque assist features arranged therein such that the set of opaque assist features align alternately with the opaque areas of the main feature. Specifically, the set of transmissive assist features may be aligned between two adjacent transmissive areas of the main feature. And the set of opaque assist features may be similarly aligned between two adjacent opaque areas of the main feature.

The opaque and transmissive areas of the main feature may be arranged as arrays of parallel lines or other configurations depending on the circuit design desired. In some examples of the invention, the opaque areas of the main feature may reflect the regions of the photoresist layer to be exposed during photolithographic process. For other examples, the transmissive areas of the main feature may reflect the unexposed regions of the photoresist layer. In accordance with one example of the present invention, the set of opaque assist features includes first opaque portions aligning with the transmissive areas. The set of opaque assist features may further include second opaque portions aligning with the opaque areas. The opaque assist features may be applied or disposed in the transmissive edge of the main feature in such a way that the first opaque portions are separated from the second opaque portions by the transmissive edge. The first opaque portions may be disposed adjacent to the transmissive areas, with each of the first opaque portions separated from its neighboring first opaque portions by the transmissive edge. Also, each of the second opaque portions may be separated from its neighboring second opaque portions by the transmissive edge.

The first opaque portions may be separated from the second opaque portions by a first distance, and the second opaque portions may be separated from the opaque areas of the main feature by at least the first distance and the height of the first opaque portion. As examples of the invention, the first distance may be less than 0.6 $\lambda$/NA, wherein $\lambda$ is the wavelength of the light source used during photolithography, and NA is the numerical aperture of the optical system. In accordance with some examples, the first distance may be greater or equal to 0.3 $\lambda$/NA. For example, the first distance may range from 0.4 $\lambda$/NA to 0.6 $\lambda$/NA. In addition, the first opaque portions may be separated from the main feature by a second distance. Therefore, the second opaque portions may be separated from the opaque areas of the main feature by the first distance, height of the first opaque portion, and the second distance. As a specific example, the second distance may be zero.

In terms of the dimension, each of the opaque assist features may have a dimension of less than 0.6 $\lambda$/NA. For example, the width (w) or height (h) of the opaque assist feature may be 0.3 $\lambda$/NA or less. And when the width of the opaque assist feature is less than 0.3 $\lambda$/NA, the corresponding height may be any value less than or equal to 0.6 $\lambda$/NA, and vice versa. As a specific example of the invention, the opaque assist features have their dimensions that are less than 0.6 $\lambda$/NA and greater than 0.4 $\lambda$/NA. In accordance with certain examples of the invention, the opaque assist features may include opaque squares or opaque rectangles.

Within the opaque edge of the main feature, the set of transmissive assist features which includes the first and second transmissive portions is also applied. The transmissive assist features may similarly share the same dimension constrains as the opaque assist features of the mask. The first transmissive portions may be disposed adjacent to the opaque areas, with each of the first transmissive portions separated from its neighboring first transmissive portions by the opaque edge. The first transmissive portions may be separated from the second transmissive portions by the first distance, and the second transmissive portions may be separated from the transmissive areas of the main feature by at least the first distance and height of the first opaque portion. And each of the second transmissive portions may be separated from its neighboring second transmissive portions by the opaque edge. In addition, the first transmissive portions may be separated from the opaque areas by the second distance. Therefore, the second transmissive portions may similarly be separated from the transmissive areas of the main feature by the first distance, height of the first transmissive portion, and second distance. In accordance with other examples of the invention, the transmissive assist features may also include transmissive squares or transmissive rectangles. Accordingly, the assist features of the invention may be provided to create different tones from the edges of the main feature. Besides the improvement from the line end shortening problem, the angles of incidence are also kept uniform using the mask of the invention to prevent the corner rounding problem. Such arrangement of the assist features also ensure that the assist features are not erroneously printed out.

Figure 3B:
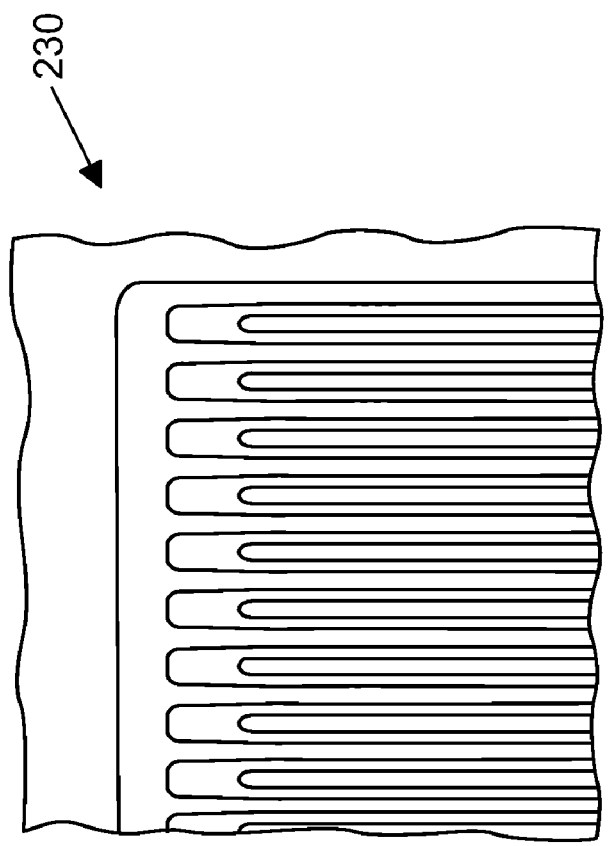
Figure 3A:
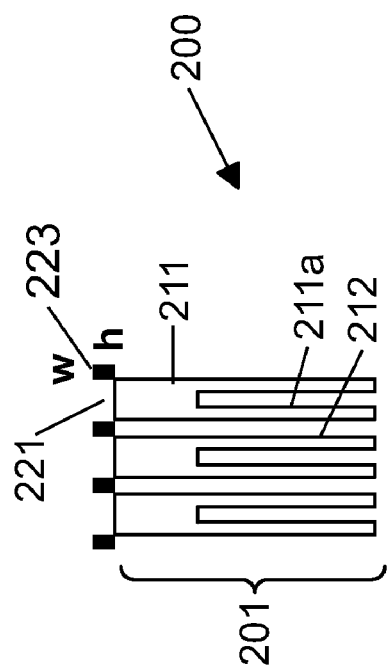
FIG. 3a is a partial plan view of a mask according to one example of the present invention.

One specific example of mask is partially illustrated in FIG. 3a. Referring to FIG. 3a, the mask 200 has a main feature 201 which includes opaque areas 211 and intervening transmissive areas 212 arranged as an array to reflect the printed feature. Each of the opaque areas 211 has a hollow portion or transmissive portion 211a to allow incident light to pass through. At the top end of the main feature 201, a transmissive edge 221 is provided. A set of opaque assist features including first opaque rectangles 223 are arranged within the transmissive edge 221 in such a way that the first opaque rectangles 223 are located to align with the transmissive areas 212 and substantially adjacent to corners 213 of the opaque areas 211 as shown in FIG. 3a. In other words, the first opaque rectangles 223 align alternately with the opaque areas 211 of the main feature 201. Each of the first opaque rectangles 223 has a dimension that is less than or equal to 0.6 λ/NA. For example, the first opaque rectangle 223 has a width (w) or height (h) of less than or equal to 0.6 λ/NA. FIG. 3b depicts a printed image feature 230 with improved profile resulted from exposure using the mask 200 illustrated in FIG. 3a.

Figure 4:
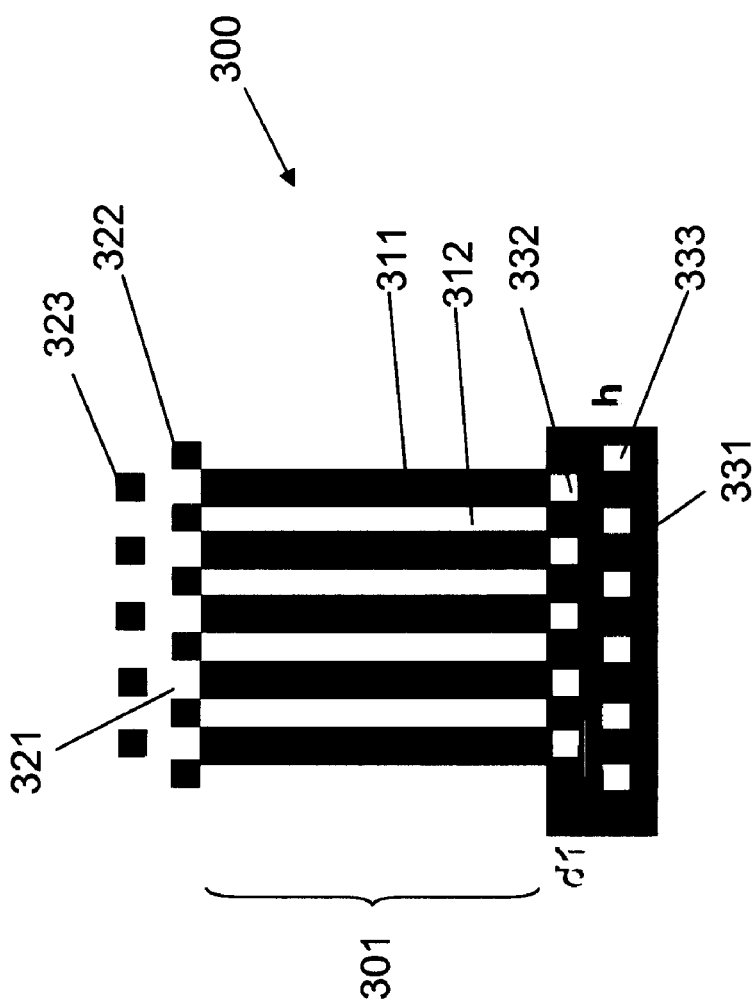
FIG. 4 is a plan view of a mask according to another example of the present invention.

Another example of the mask 300 is also provided as illustrated in FIG. 4. Referring to FIG. 4, the mask 300 has a main feature 301 which includes opaque areas 311 and intervening transmissive areas 312 arranged as an array to reflect the printed image feature. At the top end of the main feature 301, a transmissive edge 321 may be provided. The mask 300 also has a set of opaque assist features which include first and second opaque squares 322 and 323 arranged within the transmissive edge 321 such that the set of opaque assist features 322 and 323 align alternately with the opaque areas 311 of the main feature 301. The first opaque squares 322 align with the transmissive areas 312 and are substantially adjacent to corners 313 of the opaque areas 311 as shown in FIG. 4. The second opaque squares 323 align with the opaque areas 311 of the main feature 301 and are separated from the first opaque squares 322 by a distance d1 that ranges from about 0.4 λ/NA to about 0.6 λ/NA. In one example of the invention, each of the first and second opaque squares 322 and 323 has a dimension, such as width or height of less than or equal to 0.6 λ/NA. In one specific example, each of the first and second opaque squares 322 and 323 may have a width or height that ranges from 0.4%/NA to 0.6 λ/NA.

The main feature 301 may also have an opaque edge 331 at an opposite end of the main feature 301. A set of transmissive assist features that include the first and second transmissive squares 332 and 333 are arranged within the opaque edge 331 such that the set of transmissive assist features 332 and 333 align alternately with the transmissive areas 312 of the main feature 301. As shown in FIG. 4, the first transmissive squares 332 align with the opaque areas 311 and are substantially adjacent to corners 314 of the transmissive areas 312. The second transmissive squares 333 align with the transmissive areas 312 and are separated from the first transmissive squares 332 by the distance d1 that ranges from about 0.4 λ/NA to about 0.6 λ/NA. In another example of the invention, each of the first and second transmissive squares 332 and 333 has a dimension, such as width or height of less than or equal to 0.6 λ/NA. According to one specific example, each of the first and second transmissive squares 332 and 333 may have a width or height that ranges from 0.4 λ/NA to 0.6 λ/NA.

It is noted that the assist features of the invention are not limited to specific geometrical shapes as described above. Other shapes of the assist features, including but not limited to circular, oval, triangular and polygonal shapes may also be encompassed within the scope of the invention as long as their dimensions meet the constrains set forth above.

Examples of the present invention also provide a system for exposing a photoresist layer during semiconductor fabrication. The system provides a mask having a main feature with opaque and transmissive areas arranged to reflect an image feature of the photoresist layer, an opaque edge or a transmissive edge located at one end of the main feature, wherein the opaque edge includes a set of transmissive assist features arranged therein such that the set of transmissive assist features align alternately with the transmissive areas of the main feature and the transmissive edge includes a set of opaque assist features arranged therein such that the set of opaque assist features align alternately with the opaque areas of the main feature. The system also includes a positioning means for positioning the mask over the photoresist layer and an exposure means for exposing the photoresist layer through the mask.

In accordance with examples of the invention, the mask is positioned over the photoresist layer on a surface of a semiconductor wafer by the positioning means. The exposure means then exposes the photoresist layer through the mask. The mask may be subjected to either a single patterning process or double patterning process depending on the image feature required for the photoresist layer. And the patterning process may include those that involve single exposure or double exposure to the mask. The exposure means includes but is not limited to commercially available photolithography exposure tool, equipment, machine. The exposed photoresist layer is then developed using a photoresist developer. Depending on whether photoresist is a positive or negative type, the exposed or unexposed portions may be dissolved by the developer. The semiconductor fabrication may further include chemical etching, deposition, ion implantation or other necessary processes to the remaining portions or material layers. For example, the wafer may be etched through the photoresist layer by wet etching or dry etching to yield the desired feature.

In addition, the present invention also provides an integrated circuit having a line end created through use of a mask that controls line end shortening and corner rounding arising from proximity effects. The mask includes a main feature having opaque and transmissive areas arranged to reflect a patterned feature of the line end, an opaque edge or a transmissive edge located at one end of the main feature, wherein the opaque edge includes a set of transmissive assist features arranged therein such that the set of transmissive assist features align alternately with the transmissive areas of the main feature, and the transmissive edge includes a set of opaque assist features arranged therein such that the set of opaque assist features align alternately with the opaque areas of the main feature.

In accordance with examples of the invention, the process for fabricating a semiconductor chip with polysilicon lines created through use of the mask may also be provided. The invention is not limited to creating line ends in polysilicon lines. It can also used to create line ends in metal lines or any other type of signal line. Note that the above process can be carried out automatically under software control. Alternatively, the above process can be carried out manually by a human being. In addition, the mask design of the invention may be implemented in either a single patterning or double patterning process while still maintaining a high tolerance of overlay shift.

Other examples of the invention will be apparent to those skilled in the art from consideration of the specification and practice of the invention disclosed herein. It is intended that the specification and examples be considered as exemplary only, with a true scope and spirit of the invention being indicated by the following claims.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A mask for producing an image feature on an image surface during a semiconductor fabrication process, the mask comprising:

a main feature having opaque and transmissive areas arranged in the form of the image feature, each end of the main feature including at least one of an opaque edge and a transmissive edge;

the opaque edge includes a set of transmissive assist features arranged therein such that the set of transmissive assist features align alternately with the transmissive areas of the main feature, and the transmissive edge includes a set of opaque assist features arranged therein such that the set of opaque assist features align alternately with the opaque areas of the main feature.

2. The mask according to claim 1, wherein the set of opaque assist features comprises first opaque portions aligning with the transmissive areas of the main feature and the set of transmissive assist features comprises first transmissive portions aligning with the opaque areas of the main feature.

3. The mask according to claim 2, wherein the set of opaque assist features further comprises second opaque portions aligning with the opaque areas, and the set of transmissive assist feature further comprises second transmissive portions aligning with the transmissive areas.

4. The mask according to claim 3, wherein the first opaque portions are separated from the second opaque portions by a distance of less than 0.6 .lamda./NA, and .lamda. is the wavelength of the light source used during photolithography.

5. The mask according to claim 3, wherein the first transmissive portions are separated from the second transmissive portions by a distance of less than 0.6 .lamda./NA, and .lamda. is the wavelength of the light source used during photolithography.

6. The mask according to claim 4 or 5, wherein the distance is greater or equal to 0.3 .lamda./NA.

7. The mask according to claim 4 or 5, wherein the distance ranges from 0.4 .lamda./NA to 0.6 .lamda./NA.

8. The mask according to claim 1, wherein each opaque assist feature or transmissive assist feature has a dimension of less than 0.6 .lamda./NA.

9. The mask according to claim 8, wherein the dimension is less than 0.3 .lamda./NA.

10. The mask according to claim 8, wherein the dimension ranges from 0.4 .lamda./NA to 0.6 .lamda./NA.

11. The mask according to claim 1, wherein the set of opaque assist features includes opaque squares or opaque rectangles.

12. The mask according to claim 1, wherein the set of transmissive assist features includes at least one of transmissive squares and transmissive rectangles.

* * * * *